United States Patent [19]
McMahan et al.

[11] Patent Number: 5,818,691
[45] Date of Patent: Oct. 6, 1998

[54] PORTABLE COMPUTER DOCKING SYSTEM WITH PUSH TO ENGAGE AND PUSH TO DISENGAGE CONNECTION MODULE

[75] Inventors: Robert L. McMahan, Cedar Park; Sergey G. Podwalny, Austin, both of Tex.

[73] Assignee: Dell USA, L.P., Round Rock, Tex.

[21] Appl. No.: 786,168

[22] Filed: Jan. 21, 1997

[51] Int. Cl.⁶ .............................. G06F 1/16; H05K 7/12; F16B 21/07; H01R 13/627

[52] U.S. Cl. .......................... 361/686; 361/726; 361/740; 439/372; 439/153; 403/327; 403/325

[58] Field of Search ...................... 364/708.1; 439/372, 439/378, 153, 155; 403/326, 327, 321, 325, 343; 361/683, 686, 725, 726, 732, 740, 747

[56] References Cited

U.S. PATENT DOCUMENTS

| | | | |
|---|---|---|---|
| 4,980,800 | 12/1990 | Furuta | 361/683 X |
| 5,044,975 | 9/1991 | DiBene, II et al. | 439/153 X |
| 5,125,849 | 6/1992 | Briggs et al. | 439/378 |
| 5,580,182 | 12/1996 | Lin | 403/325 |
| 5,619,397 | 4/1997 | Honda et al. | 361/686 |

*Primary Examiner*—Michael W. Phillips
*Attorney, Agent, or Firm*—Skjerven, Morrill, MacPherson, Franklin, & Friel, L.L.P.; Stephen A. Terrile

[57] ABSTRACT

A system for docking a portable computer to a docking station. The portable computer including a connection module and an electrical connector capable of mating an electrical connector attached to the docking station. The connection module including a spring for providing the force necessary to unmate the electrical connectors. The connection module including a sliding block for receiving an alignment pin attached to the docking station. The alignment pin includes a groove. The connection module includes a retaining member with a gripping surface which engages the groove when the computer is docked in the docking station. To dock the portable computer in the docking station, the user pushes the portable computer towards the docking station electrical connector so as to mate the portable computer electrical connector with the docking station electrical connector. To undock the portable computer, the user pushes the portable computer towards the docking station electrical connector and releases.

18 Claims, 12 Drawing Sheets

PORTABLE COMPUTER DOCKING SYSTEM WITH PUSH TO ENGAGE AND PUSH TO DISENGAGE CONNECTION MODULE

BACKGROUND OF THE INVENTION

1. Field of the Invention

The present invention relates generally to a computer system and more specifically to a system and method for docking a portable computer to a docking station.

2. Description of the Related Art

Personal computer systems in general and IBM compatible personal computer systems in particular have attained widespread use. These personal computer systems now provide computing power to many segments of today's modern society. A personal computer system can usually be defined as a desktop, floor-standing, or portable computer that includes a system unit having a system processor with associated volatile and non-volatile memory, a display monitor, a keyboard, a hard disk storage device or other type of storage media such as a floppy disk drive or a compact disk read only memory (CD ROM) drive. One of the distinguishing characteristics of these systems is the use of a system board or motherboard to electrically connect these components together. A personal computer system may also include one or a plurality of I/O devices (i.e. peripheral devices) which are coupled to the system processor and which perform specialized functions. Examples of I/O devices include modems, sound and video devices or specialized communication devices. Mass storage devices such as hard disks drives, CD-ROM drives and magneto-optical drives are also considered to be peripheral devices. Other examples of peripheral devices include a monitor, a keyboard, a mouse or other cursor control devices, a printer, and various types of expansion cards.

These personal computer systems are information handling systems which are designed primarily to give independent computing power to a single user or group of users and are inexpensively priced for purchase by individuals or small businesses.

Portable computers are often referred to as laptop, notebook or subnotebook computers. These computers typically incorporate a flat panel display such as a liquid crystal display (LCD) or other relatively small display. Portable, battery-powered portable computers have become increasingly popular over the last several years due to their light weight and small size that permit them to be easily hand-carried in an ordinary briefcase and used by business travelers in cramped spaces, such as on airline seat back trays, lacking electrical plug-in facilities. The modern portable computer typically has incorporated therein both hard and floppy disk drives, a display built into its lid portion, and a keyboard built into its main body portion. It is a fully self-contained computer system able to be conveniently used, for at least short periods of time, in situations and locations in which the use of a much larger desktop computer is not feasible.

As is well known, however, even state-of-the-art portable computers have certain limitations and disadvantages, arising form their otherwise desirable diminutive sizes, compared to their much larger desktop computer counterparts. For example, the compact keyboard of a portable computer is often considerably less comfortable to use for extended periods of time compared to the more spacious separate keyboards normally provided on desktop computers.

Additionally, to reduce the space requirements for the typical portable computer keyboard, many of its keys, that would have but a single function on a desktop computer keyboard, are provided with multiple functions which can be confusing to a user switching back and forth between desktop and portable computers. Moreover, compared to its desktop computer counterpart, the portable computer monitor typically does not provide its viewers with as sharp a display image. After an extended computing session, this reduction in display clarity can cause the computer user to experience at lease some degree of eye strain. Another disadvantage of portable computers is that, due to their small size, they typically do not provide access for expansion cards such as, for example, network, sound, graphics accelerator and multimedia cards which desktop computer units are conveniently configured to receive.

Because of these shortcomings inherent in the portable computer, it is a common practice for their owners to also purchase a desktop computer system for home or office use. A typical scenario for these two-computer owners, upon returning home after using their portable computer on a business trip, is to transfer their files, data, spreadsheets, and the like from their portable computer to their desktop computer and continue working on the initiated project or projects using the larger and more comfortable desktop peripheral equipment such as the external monitor, keyboard, and mouse.

The task of transferring data from the portable computer to the desktop computer (and vice versa in preparation for a subsequent road trip) is not a particularly convenient one for the computer user. It is typically accomplished by the often time consuming method of (1) inserting a floppy disk into the portable computer, (2) copying a portion of the data from the portable computer hard drive onto the inserted floppy disk, (3) removing the floppy disk from the portable computer, (4) inserting the removed floppy disk onto the desktop computer, (5) copying the data from the floppy disk onto the hard drive of the desktop computer, and then (6) repeating steps (1) through (5), as necessary, until all of the desired data is transferred from the portable computer to the desktop computer.

Alternatively, various software is available for use in a portable computer to download data therefrom to a desktop computer through a cable interconnected between the serial ports on the notebook and desktop computers. This procedure, while somewhat more convenient than laboriously shuffling floppy disks back and forth between the two computers, has other disadvantages. For example, it requires the additional purchase and installation of the transfer software which occupies space in the notebook hard drive-space which is often at a premium in the relatively small hard drives typically provided in portable computers.

Moreover, each time data is to be transferred from the portable computer to the desktop computer, a cable must be interconnected between the two computers and subsequently disconnected. This can be a rather awkward task since the serial port on a desktop computer is typically located on its back side in the midst of a jumble of other cables.

In addition to the inconvenience of these conventional methods of transferring data back and forth between notebook and desktop computers there is, of course, the considerable expense entailed in purchasing two complete computer systems to provide both the compactness and portability of a portable computer and the greater capacity and use comfort of a desktop computer. Some of this expense may be avoided by purchasing (in addition to the portable computer) only desktop computer peripheral equipment such as a monitor, keyboard, mouse and external hard drive-for home or office use.

When the user works at his home or office station he connects the portable computer to the desktop computer peripheral equipment, using the necessary interconnect cables, to fashion a hybrid computer system utilizing the portable computer CPU in conjunction with the desktop computer peripheral devices. While this alternative approach is less expensive than purchasing two complete computer systems, it is highly inconvenient due to the number of cables that must be connected between the portable computer and the desktop peripherals, to "construct" the hybrid systems and later be disconnected to free the portable computer for travel use. Additionally, the jumble of interconnect cables sprawling across the desk or table area creates a decidedly disorderly and unattractive work station.

In response to these problems and inconveniences, interconnecting structures commonly referred to as "docking stations" have been previously proposed. A docking station is basically an interconnecting structure designed to be left in place on a home or office desktop. The portable computer may be removably connected to the docking station by engaging mating plugs or sockets attached to the portable computer and the associated docking station. The docking station is typically connected to external desktop peripheral devices, such as a monitor, keyboard and mouse, that remain in place on the desktop work station. Disposed within the docking station housing are various components that serve to operatively connect devices when the portable computer is plugged into the docking station. However the docking station is not provided with a central processing unit. Instead when the portable computer is "docked" in this manner, the central processing unit of the portable computer is utilized in the resulting desktop computer work station and the desktop keyboard, monitor and mouse are used in any subsequent desktop computing tasks. After these tasks are completed, the portable computer can simply be unplugged from the docking station and carried away for use in its usual self-contained laptop mode. Therefore, the function of a docking station is to effect connection between the portable computer a various pieces of ancillary or peripheral devices without the need for individual cable connections to the portable computer, thereby facilitating the conversion of the portable computer between its laptop mode of operation and a desktop mode of operation.

Compared to the previous necessity of purchasing a complete desktop computer system in addition to a portable computer, the use of this docking station concept provides several distinct advantages. For example, since the docking station is not furnished with its own central processing unit (using, in place thereof, the portable computer CPU) the overall cost of providing both portable and home or office-based computer work stations is substantially reduced.

Additionally, the previous inconvenience of transferring data from the portable computer to the desktop system is essentially eliminated since the requisite notebook/desktop computer interface for this data transfer is achieved simply by plugging the portable computer into the docking station (which may have an internal hard drive or be connected to an external hard drive) without the need for switching floppy disks back and forth or using an external interconnection cable. Moreover, from a connection convenience standpoint, the use of the plug-in docking station is clearly preferable to laboriously connecting the computer directly to desktop peripheral devices using several separate interconnect cables.

To electrically and operatively couple the inserted portable computer to the desktop peripheral devices via the docking station, a pin type connector is positioned within the interior of the docking station and is typically coupled to a printed wiring board therein which, in turn is connected to the peripheral devices. As the computer is inserted into the interior of the docking station a guide structure engages the portable computer to align a pin type connector so that when the computer is moved to the docking station connector, either manually or by motorized drive system within the docking station, the two pin type connectors mate to thereby "dock" the portable computer to the docking station and operatively couple it with the desktop peripherals.

Since the relatively small plug-in interface between the docking station and the notebook computer must effect a multitude of electrical connections between the internal operating components of the portable computer and the docking station housing, high density pin connectors (one on the portable computer and one on the docking station) are typically used to provide the plug-in computer/docking station mechanical interconnection.

A problem with docking systems is in providing a mechanism that conveniently locks the portable computer system in the docked position and can conveniently be used to unlock the portable computer system. The locking or latching mechanism is also necessary to minimize the mechanical stress on the electrical connector. Manual latching mechanisms have been disclosed to exert a mechanically advantaged connection force on the portable computer during insertion and to hold the docked computer in place on the docking station. These latching systems are typically operated by placing the portable computer on or adjacent to the docking station in a spaced relationship with the docking station connector structure and then manually pivoting a latch structure against the computer to drive its connector pin structure into a mating engagement with the docking station connector pin structure. One problem with these latch system is that they are bulky with the manual latch taking up surface space on the docking station. Furthermore, such mechanisms may require that projections stick out past the sides of the docking station.

Motorized docking devices have been designed to move the inserted portable computer, to align the connectors, and carry the portable computer forward in the docking bay to mate the connectors. However, these motorized systems can significantly increase the size of the docking station as well as the cost.

What is needed is a system that is compact and inexpensive for docking and undocking a portable computer to a docking station.

SUMMARY OF THE INVENTION

It has been discovered that providing a portable computer docking and ejecting system with a spring and a retaining member physically linked to the portable computer advantageously provides a compact and inexpensive docking system for docking and undocking a portable computer from a docking station.

More specifically, in one aspect of the invention, a portable computer docking and ejecting system includes a first electrical connector attached to a portable computer. The first electrical connector is electrically coupled to a processor within the portable computer. The system includes a second electrical connector physically coupled to a docking station. The second electrical connector is capable of being electrically coupled to at least one peripheral device. The second electrical connector capable of being mated to the first electrical connector. The processor electrically coupled to the second connector when the first electrical connector is mated to the second electrical connector. The first electrical connector mated to the second electrical connector when the portable computer system is in a docked position. The system also includes a spring capable of providing a force against the docking station and a force against the portable computer. The spring in a loaded position when the portable computer is in the docked position. The system further including a retaining member including a gripping surface. The retaining member physically linked to the portable computer and is movable as to the portable computer. The gripping surface capable of engaging a portion of the docking station to physically link the portable computer to the docking station. The retaining member in a first position when the gripping surface is engaged with the portion of the docking station. The retaining member capable of moving from the first position to disengage the gripping surface from the portion of the docking station.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The following sets forth a detailed description of the best contemplated mode for carrying out the invention. The description is intended to be illustrative of the invention and should not be taken to be limiting.

Figure 1:
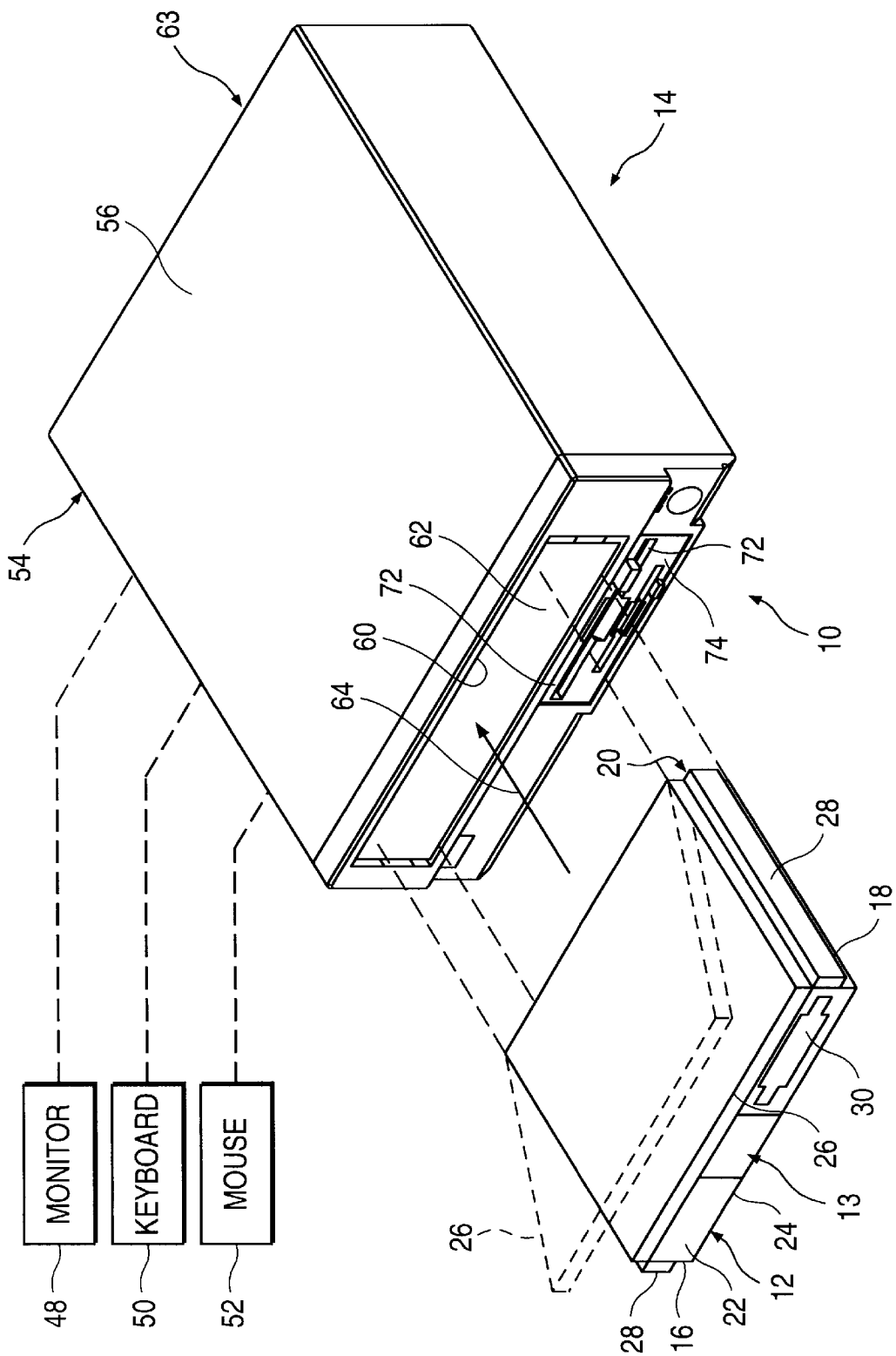
FIG. 1 is a perspective view of one embodiment of a portable computer and a docking station.

Referring to FIG. 1, the present invention provides a portable computer/expansion chassis docking system 10 including a portable computer 12 and an enclosed docking station structure or expansion chassis 14, hereinafter referred to simply as the "docking station." Portable computer 12 is of a relatively thin rectangular configuration and has a base portion 13 with left and right side panels 16 and 18, front and rear side panels 22 and 20, and a bottom side 24.

Pivotally secured to the top side of the base portion 13 is a rectangular lid portion 26 which, as indicated in phantom in FIG. 1, may be pivoted upwardly in the usual manner to expose a keyboard (not shown) located on the top side of the base portion 13, and a display panel (not shown) located on the underside of the lid portion 26. In the embodiment shown, a pair of generally rectangularly configured guide rails 28 longitudinally extend along the left and right side wall panels 16 and 18 and laterally project outwardly therefrom.

Portable computer 12 includes a variety of internally mounted operating components (not illustrated) including a hard drive, a floppy drive having a disk insertion slot 30 on the front side panel 22, and a system board or mother board.

In the embodiment shown, the docking station 14 has a rectangular configuration and is larger than the portable computer 12. Docking station 14 is adapted to rest on a table or desk portion of a home or office computer work station. As schematically depicted in FIG. 1, the docking station is representatively connected to conventional external desktop computer peripheral devices such as monitor 48, a keyboard 50 and a mouse 52. These peripheral devices are connected to the docking station 14 through individual electrical connectors located on the back side 63 of the docking station 14 (not shown). Docking station 14 also includes network connector (not shown) for connecting the docking station (and portable computer) to a server or other network device. The docking station 14 may be contain slots for receiving Industrial Standard Architecture (I.S.A.) cards, Peripheral Component Interconnect (PCI) cards, Personal Computer Memory Card International Association (PCMCIA) cards, or other expansion cards. In the embodiment shown, docking station 14 includes a housing 54 having a top cover portion 56 which is removable from a bottom wall portion 58 (see FIG. 2) of the housing to expose the operating components within the docking station.

Extending along the front side of the docking station 14 as shown in FIG. 1, is a horizontally elongated rectangular opening 60 which is normally covered by a door plate 62. Door plate 62 is connected along its lower side edge to the docking station for downward and rearward pivotal motion into the interior of the docking station, and is spring-biased toward its upright position, shown in FIG. 1, in which it covers the opening 60.

The portable computer 12 is rearwardly insertable into the docking station 14 through the opening 60 as indicated by the arrow 64 in FIG. 1. The portable computer is manually inserted by a user into the docketing station 14 to electrically couple the portable computer 12 to peripheral devices such as the external peripheral devices 48, 50 and 52, the expansion and network cards, and other peripheral devices previously mentioned or unmentioned, through circuitry in the docking station 14.

Exposed beneath the door plate 62 are the front ends of a 3.5" floppy disk drive 72 and a 5.25" floppy disk drive 74. When the portable computer is docked in the docking station, the CPU of the portable computer is operablely and electrically coupled to these devices.

Figure 2:
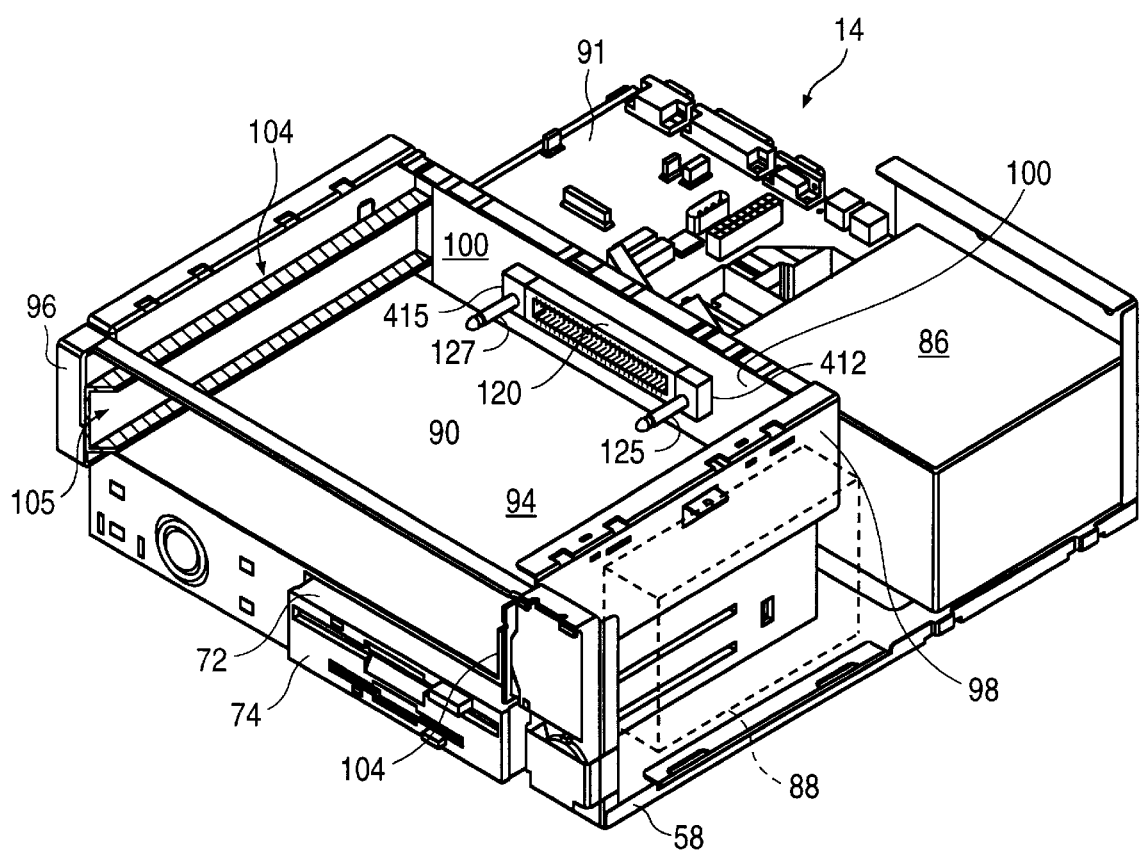
FIG. 2 is a perspective view of the docking station with the protective housing removed.

FIG. 2 illustrates the docking station 14 with its top housing cover portion 56 removed from the bottom housing wall 58 to expose the internal operating components of the docking station 14. These operating components include the previously mentioned floppy disk drives 72 and 74, a power supply unit 86, a hard disk drive 88 shown in phantom in FIG. 2, and a system planar board 91.

As opposed to the motherboard normally incorporated in a computer system (such as the motherboard in the portable computer 12), the planar board 91 does not provide full computer processing control. Instead, in the embodiment shown, the planar board 91 functions to control the energization of the portable computer 12 and selected operating components of the docking station 14 to prevent potentially damaging voltage mismatches. The planar board 91 also provides an operative interface between portable computer 12 and the internal operating components in the docking station 14, the docking station drives 72, 74, 88, the external peripheral devices 48, 50, 52 and other peripheral devices not shown.

When the portable computer 12 is operatively docked within the docking station 14, the resulting desktop computing system utilizes the portable computer motherboard (not shown) as its main processing circuitry and permits the use of the desktop peripheral devices in place of the corresponding components on the portable computer. However, the user may still use the peripheral devices of the portable computer. The user is thus provided with the advantages of both the network and a desktop computer system at a considerable reduction in cost.

Also incorporated in the docking station 14 is a docking bay 90 which defines within the docking station 14 a receiving area in the form of an internal chamber into which the portable computer 12 may be inserted to be docked. The docking bay includes a bottom wall 94 and a back or rear wall 100. Extending horizontally along the inner sides of the bay walls 96 and 98 are guide rails 104. The guide rails 104 are configured to slidingly receive the portable computer guide rails 28 when the computer is manually inserted into the interior of the bay 90, through the opening 60. As the portable computer 12 is inserted rearwardly into the bay 90, the guide rails 28 of the portable computer 12 work with the guide rails 108 of the docking station to achieve a gross alignment of the portable computer electrical connector 310 (see FIG. 3) with the docking station electrical connector 120. The front portion of the guide rails 105 at the front of the docking bay 90 are initially wide to ease the insertion of the portable computer 12 but taper down to so as to properly align the alignment pins 125 and 127 of the docking station to the alignment holes 504 of the connection modules 320 and 325 (FIG. 3) of the portable computer. Other embodiments do not include guide rails 108 or 28. The docking station electrical connector 120 is mounted to the bay side of back wall 100 and is electrically connected to the system planar 91. Included adjacent to the docking station electrical connector 120 are alignment pins 125 and 127.

Figure 1A:
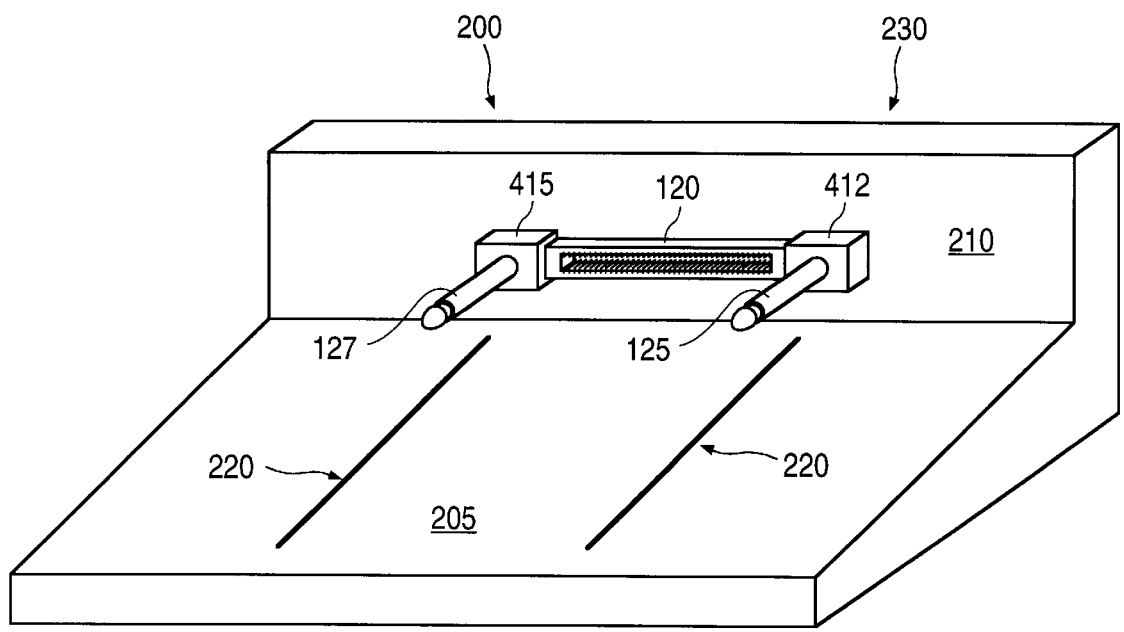
FIG. 1A is a perspective view of an alternative embodiment of a docking station.

FIG. 1A shows an alternative embodiment of a docking station. The docking station 200 is an open docking station that includes a base panel 205, a back panel 210 and guide rails 220. The docking station electrical connector 120 is mounted to the back panel 210 adjacent to the alignment pins 125 and 127. Located in the backside 230 of docking station 200 (not shown) are individual electrical connectors for electrically coupling peripheral devices such as a keyboard, a mouse, a monitor, a printer, and a serial port to the docking station electrical connector 120. Included within the docking station 200 is a printed wiring board that connects the individual peripheral connectors to the docking station electrical connector 120. With this embodiment, the portable computer 12 includes matching grooves located in the bottom 24 for gross alignment with guide rails 220 and to prevent the portable computer from sliding laterally on base panel 205 when in the docked position. In the docked position, the portable computer rests on the base panel 205 with the backside 20 facing back wall 210. One advantage of this embodiment is that it allows the use the keyboard or monitor (not shown) of the portable computer 12 while the portable computer is docked to the docking station 14.

In an other embodiment (not shown), the docking station does not include the bottom panel 205. The docking station resembles a rectangular block where one side includes the alignment pins 125 and 127 and electrical connector 120. The opposite side of the docking station includes individual peripheral connectors for electrically coupling the docking station electrical connector 120 to various peripheral devices. This embodiment is typically known as a port replicator.

Figure 3:
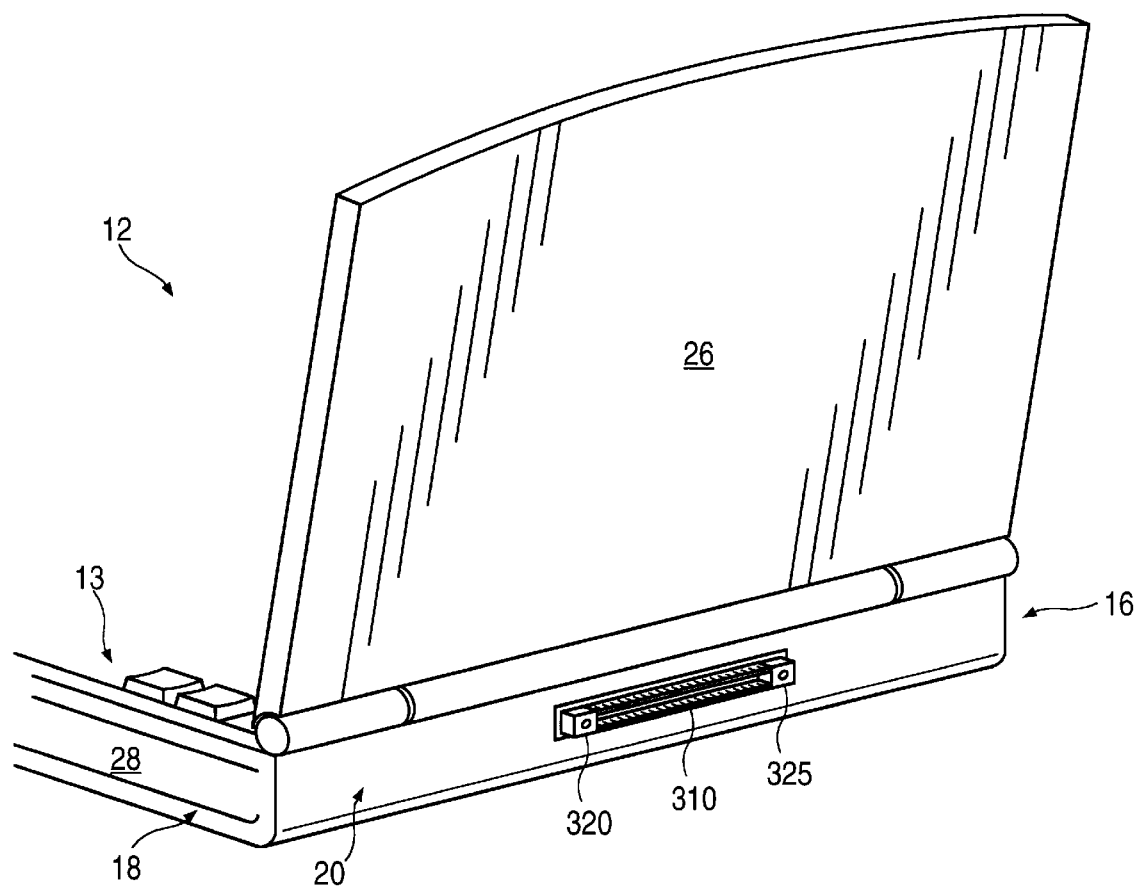
FIG. 3 is a rear view of a portable computer.

FIG. 3 shows the back side 20 of portable computer 12. Extending out from the rear panel 20 of the base portion 13 is the portable computer electrical connector 310. The portable computer electrical connector 310 is mounted to a back panel 20. In the embodiment shown, docking connector is a 240 way pin electrical connector. The electrical connector 310 is electrically coupled to various electronic device within the portable computer 12 including the system processor and motherboard. Connector 310 is capable of supplying all of the computer signals between the portable computer 12 and the docking station 14. The electrical connector 310 is capable of being mated with the docking station electrical connector 120 mounted on the back wall 100. Also included on the rear panel 20 are two connection modules 320 and 325 located adjacent to the electrical connector 310. In other embodiments, the connection modules 320 and 325 located at different locations with respect to the electrical connector 310.

In other embodiments the rear panel 18 may include other electrical connectors as well. In other embodiments, a rear sliding door may cover the electrical connector 310 and connection modules 320 and 325.

Figure 4:
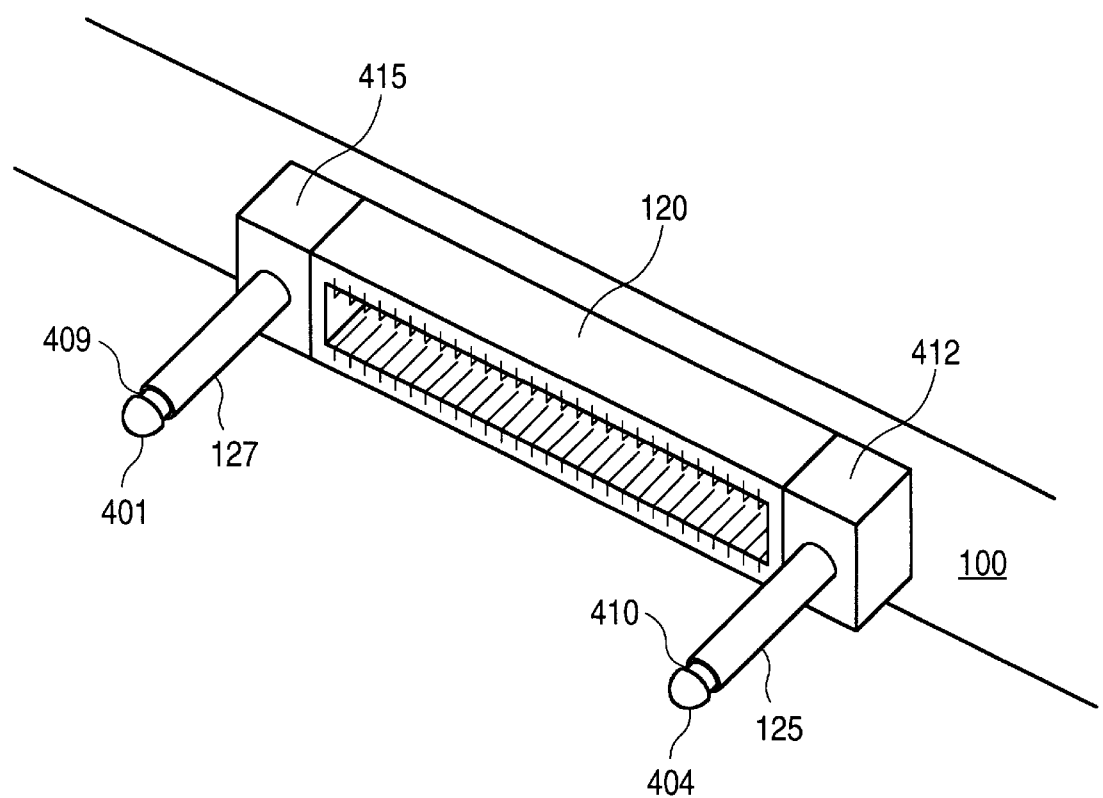
FIG. 4 is a perspective view of the docking station bay back wall including the electrical connector and alignment pins.

Referring to FIG. 4, docking station electrical connector 120 is mounted to the back wall 100 of the docking bay 90, and is electrically coupled to the system planar 91. Docking station electrical connector 120 is a 240 way pin electrical connector capable of being mated with the portable computer electrical connector 310. Electrical connector 120 is electrically coupled to the internal operating components in the docking station 14, the docking station drives 72, 74, 88, and to the external electrical connectors for the peripheral devices 48, 50, 52 and other peripheral devices previously mentioned. In the embodiment shown in FIG. 1, the electrical connector 120 is coupled to the peripheral devices via the system planar board 91. Adjacent to the docking station electrical connector 120 are alignment pins 125 and 127 which are mounted to mounting blocks 412 and 415. Mounting blocks 412 and 415 attached to the back wall 100. Alignment pins 127 and 125 each have a head portion 401 and 404, respectively, and recesses 409 and 410 located next to the head portions 401 and 404, respectively.

Figure 5:
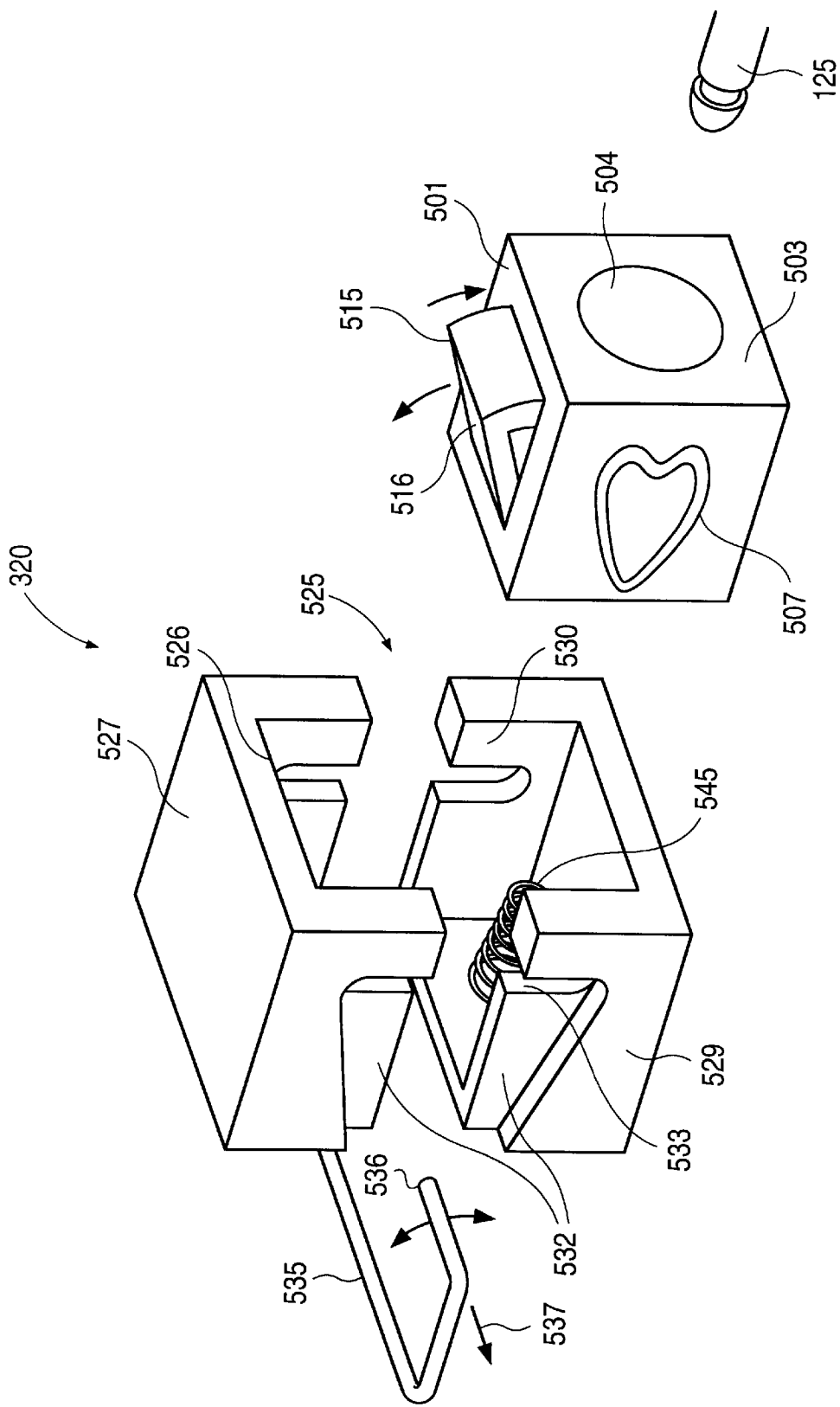
FIG. 5 is a perspective view of a disassembled connection module.

Referring to FIG. 5, the connection module 320 includes an inner body referred to as sliding block 501, and an outer encasing portion 525. In the embodiment shown, sliding block 501 is of a rectangular shape with an alignment hole 504 on the front side 503 for receiving an alignment pin 125. Sliding block 501 also including a pin retainer 515 attached to the top portion of sliding block 501 at a hinge 1022 (see FIG. 10). The sliding block 501 also includes a wire track 507 which is a groove located in the side of sliding block 501. In an alternative embodiment, a second wire track exists on the opposite side of the sliding block 501.

The encasing portion 525 of the connection module 320 is in a hollow rectangular shaped block which is separated into a top portion 527 and a bottom portion 529 for installation purposes. The top portion 527 and bottom portion 529 can be held to together by welding or other methods known in the art. The encasing portion 525 includes a front opening 530 for receiving the sliding block 501. The encasing portion is physically attached to the rear panel 20 of the portable computer such that it does not move with respect to the computer during the docking and ejecting operations. In other embodiments the encasing portion may be formed within the rear panel 20.

The bottom portion 529 includes a compression spring 545 for providing the force necessary to unmate the portable computer electrical connector 310 from the docking station electrical connector 120. One end of spring 545 is attached to the inner back wall of the lower portion 529. In the embodiment shown, compression spring 545 is a coil spring, although other types of springs may be used.

A wire bail 535 attached to the back of the encasing portion 525. The wire bail 535 is a retaining member that provides a countering force to compression spring 545 to slidably secure and physically link sliding block 501 to the encasing portion 501. Wire bail 535 includes an end portion 536 that travels in the wire track 507 to allow the sliding block 501 to slide within the opening 530 of encasing portion 525. Wire bail 535 is shaped so that the end portion 536 may move in an outward direction as shown by arrow 537.

Included on the sides of encasing portion 525 are a wire recess 532 and wire slot 533. Wire recess 532 allows for the end portion 536 to move in a vertical direction with respect to the encasing portion 525. Wire slot 533 is a slot in the side of the encasing portion 525 that allows the end portion 536 access to the wire track 507 in the side of the sliding block 501. In another embodiment, the wire bail 535 includes a second end portion and the encasing portion 525 includes a second end slot and a second wire recess located on the opposite side of the encasing portion 525.

Figure 6:
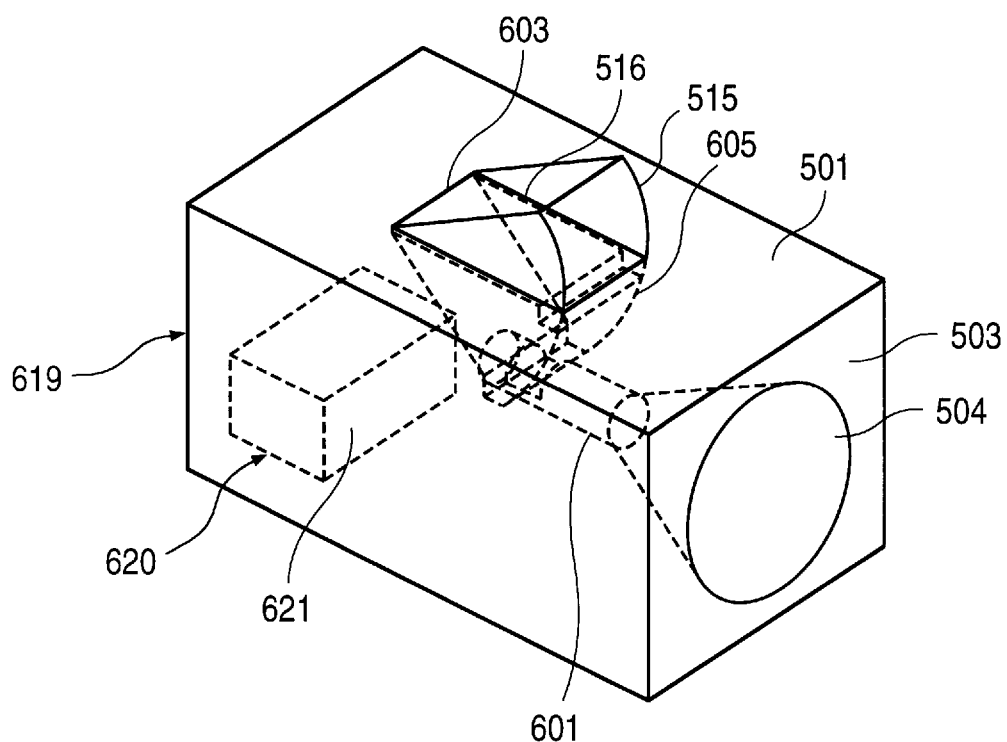
FIG. 6 is a phantom view of the inner portion of the sliding block.

FIG. 6 shows a phantom view of sliding block 501. The wire track 507 is not shown. Alignment hole 504 is recess located in the front side 503 of the sliding block 501 for receiving the alignment pin 125. The alignment hole 504 tapers into a narrow alignment tube 601 within the sliding block 501. This tapering aids in aligning the portable computer 12 with the docking station 14 so that the electrical connectors 120 and 310 are aligned when mated.

Figure 8:
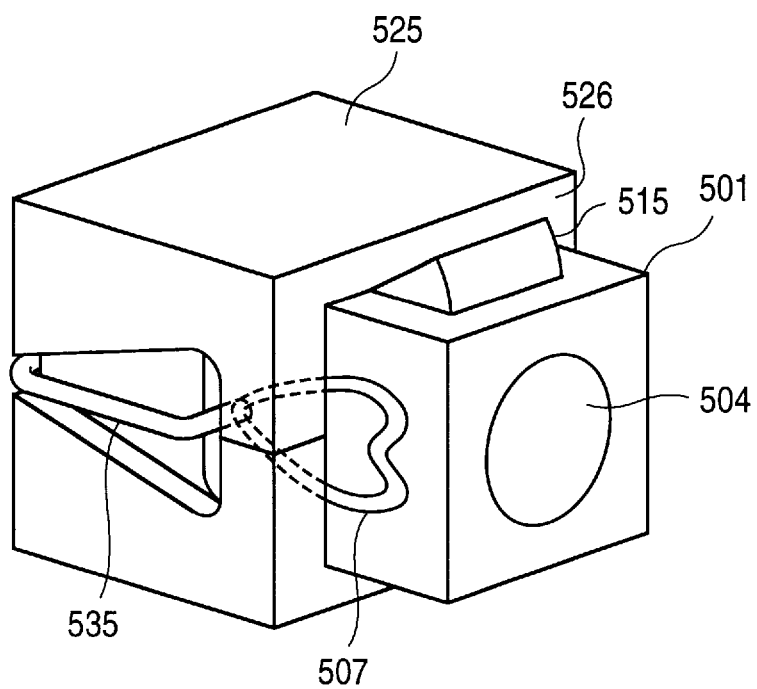
FIG. 8 is a perspective view of a connection module in an open position.
Figure 10:
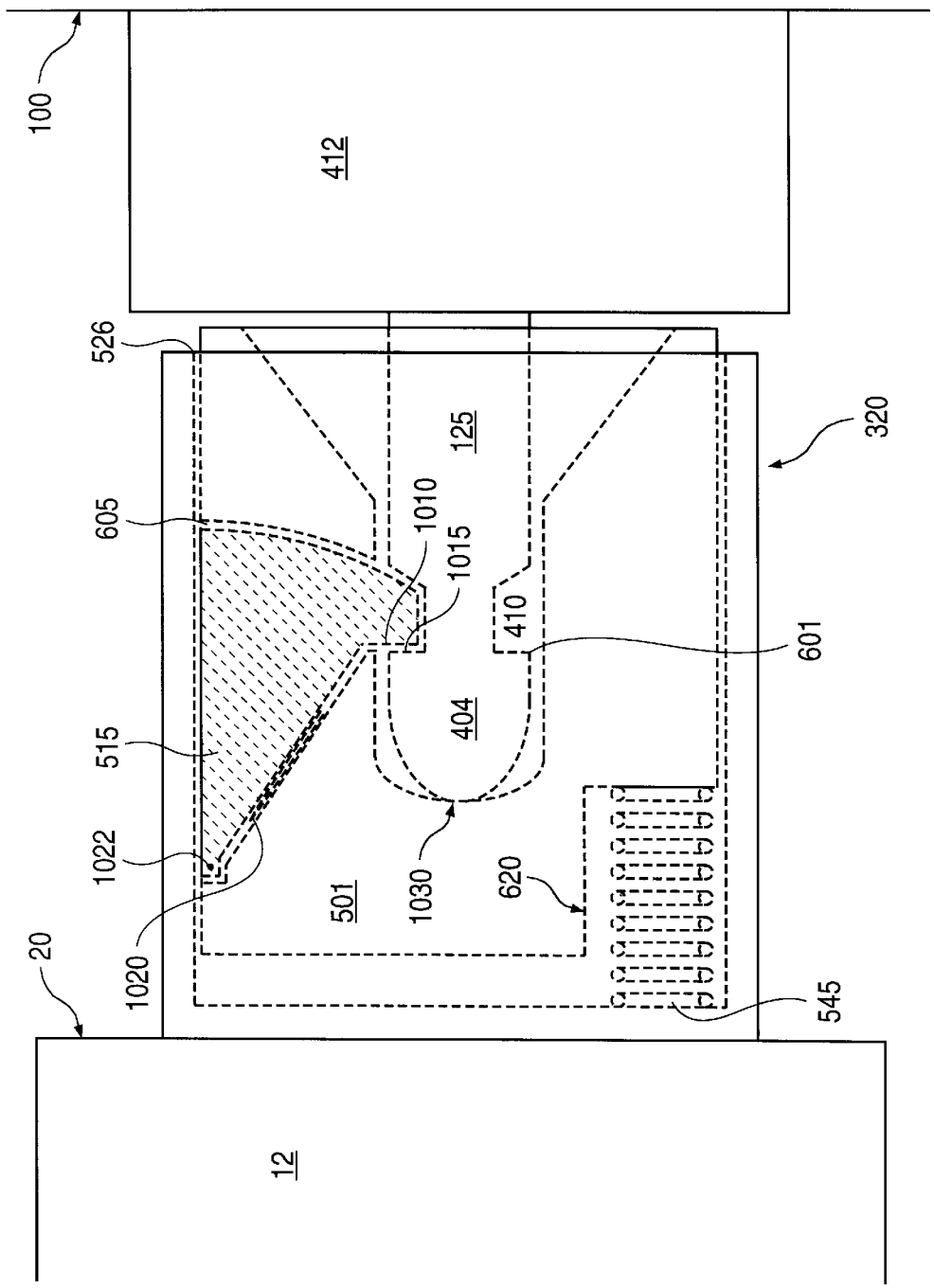
FIG. 10 is a phantom view of the connection module in the docked position.

The sliding block 501 contains a retaining pin 515 having one end 603 attached to the top part of sliding block 501 by a hinge 1022 (FIG. 10). In the embodiment shown, retaining pin 515 is a wedge shaped body with a gripping surface 1010 (FIG. 10). Retaining pin 515 is spring biased with a beam spring 1020 (FIG. 10) so that when no force is applied to the retaining pin 515, the retaining pin is in a first position with respect to the sliding block 501 as shown in FIGS. 6 and 8. In this first position, a portion of the retaining pin 515 resides above the top surface of sliding block 501. Retaining pin 515 is movable with respect to sliding block 501 in that it pivots on hinge 1022 to a second position in where the top surface 516 of the retaining pin 515 is flush with the top of the sliding block 501 (see FIG. 10). In another embodiment, retaining pin 515 is formed with sliding block 501 as one integral unit with retaining pin 515 in the first position as shown in FIG. 5. In this alternative embodiment, the retaining pin can be resiliantly moved to the second position.

Sliding block 501 includes a recess 605 that allows a portion of the retaining pin 515 to move within the sliding block 501 into the alignment tube 601 when the retaining pin 515 is in the second position. However, when in the first position, retaining pin is free of the alignment tube 601 so as to allow the alignment pin 125 to penetrate the aligning tube 601 to its position when the portable computer 12 is docked to the docking station 14 (see FIG. 10) in the docked position.

Also included within the bottom back portion of the back wall 619 of sliding block 501 is a spring recess 620. The spring recess 620 provides an area for the compression spring 545 to reside when the portable computer is in the docked position (see FIG. 10). Recess 620 allows for a majority of the sliding block 501 to be encased within the encasing portion 525 when the portable computer 12 is in the docked position. Spring 545 provides a force against wall 621 to move sliding block 501 away from the encasing portion 525 from the position of the sliding block 501 with respect to the encasing portion 525 in FIG. 10, to the open position with respect to the encasing portion 525 in FIG. 8.

Figure 7:
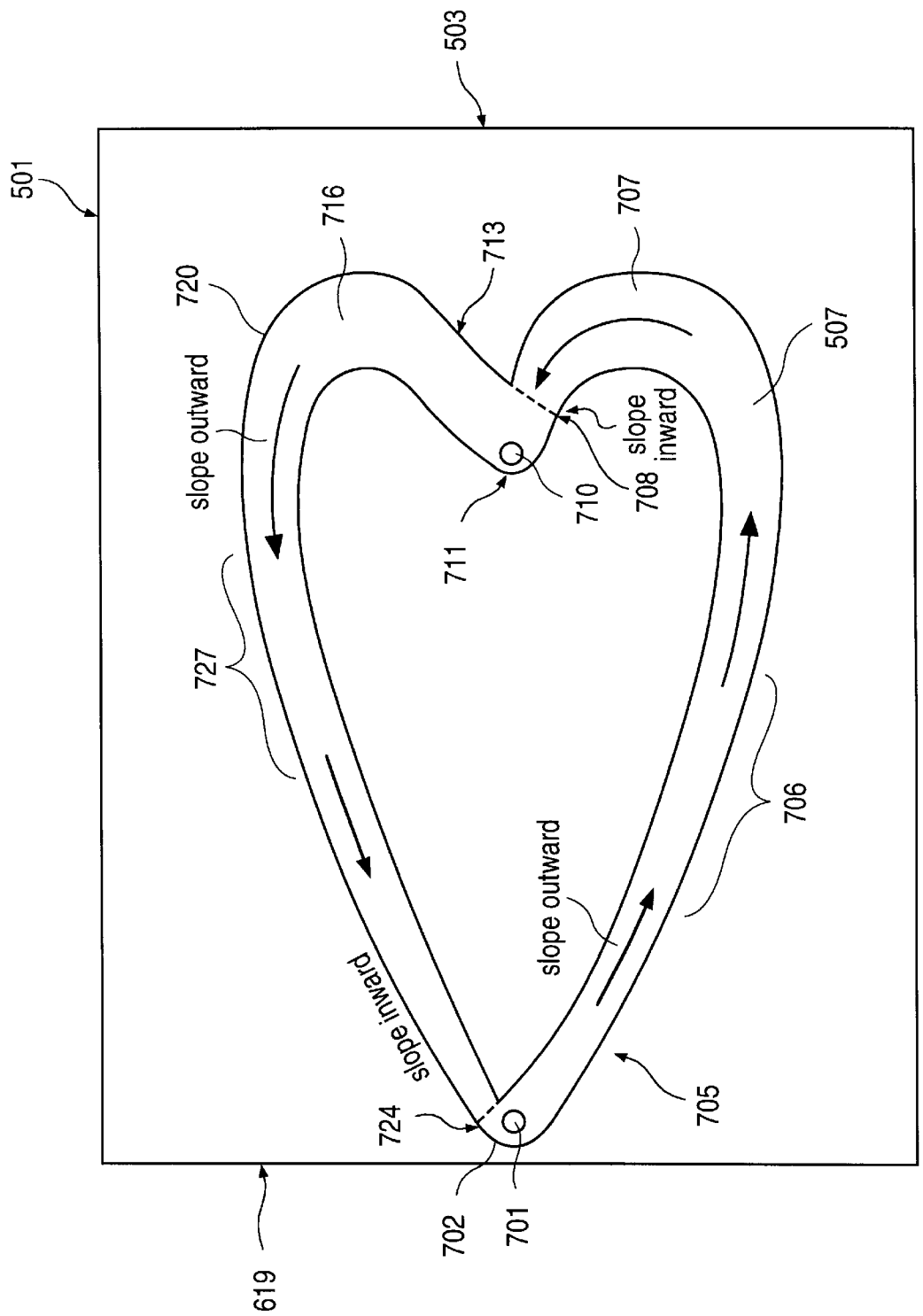
FIG. 7 is a side view of the sliding block including a wiretrack.

Referring to FIG. 7, wire track 507 is a groove located within the side of sliding block 501. The end portion 536 of wire bail 535 travels in the wire track 507 during the movement of the sliding block 501 within the encasing portion 525. Wire track 507 provide a retaining surface allowing the end portion 536 to provide a countering force to compression spring 545 so as to physically link and slidably secure sliding block 501 to the encasing portion 525.

Location 701 is the location of the end portion 536 when the sliding block 501 is in the open position with respect to the encasing portion 525, as shown in FIG. 8. Position 710 is the position of the end portion 536 when the portable computer system is docked to the docking station in the docked position (see FIG. 10). The end portion 536 travels in a generally counter clockwise direction around the wire track 507, relative to the view shown in FIG. 7. The surface of wire groove 507 sloped in various places to aid in keeping the end portion 536 from "sticking" in the track or from traveling in the wrong direction. These slopes cause the end portion of wire 536 to move inwards and outwards, relative to the view shown in FIG. 7. At approximately location 705, the wire track slopes outward, relative to the view shown in FIG. 7. At position 708, the wire track slopes sharply inward to position 710. From position 720, the wire track slopes outward. At approximately position 724, the wire track slopes sharply inward to position 701. In other embodiments, the wire track at positions 708 and 724 moves abruptly inward so as to make a clicking noise to indicate that the computer is in the docked position or in the open position, respectfully, and to aid in preventing the end portion 536 from traveling in a generally clockwise direction from locations 701 and 710, relative to the view shown in FIG. 7. In other embodiments, the shape of the wire track may vary and still perform the same function. Factors such as the shape of the sliding blocks, the shape and characteristics of the wire bail 535, the strength of the spring 545, and the degree of over travel may require the shape of the wire track 507 to vary.

The wire bail 535, the wire track 507, and the compression spring 545 all interact together so that compression module 320 functions in a similar manner as a "push-push" switch.

FIG. 8 shows the connection module 320 in the open position. In this position, the end portion 536 of the wire bail 535 resides in positions 701 of the wire track. The spring 545 provides a force pushing sliding block outward away from the encasing portion 525. The end portion 536 provide a retaining force against the edge 702 of the wire track 507 at location 701. In the open position, the connection module 320 is ready to receive an alignment pin 125.

Figure 9:
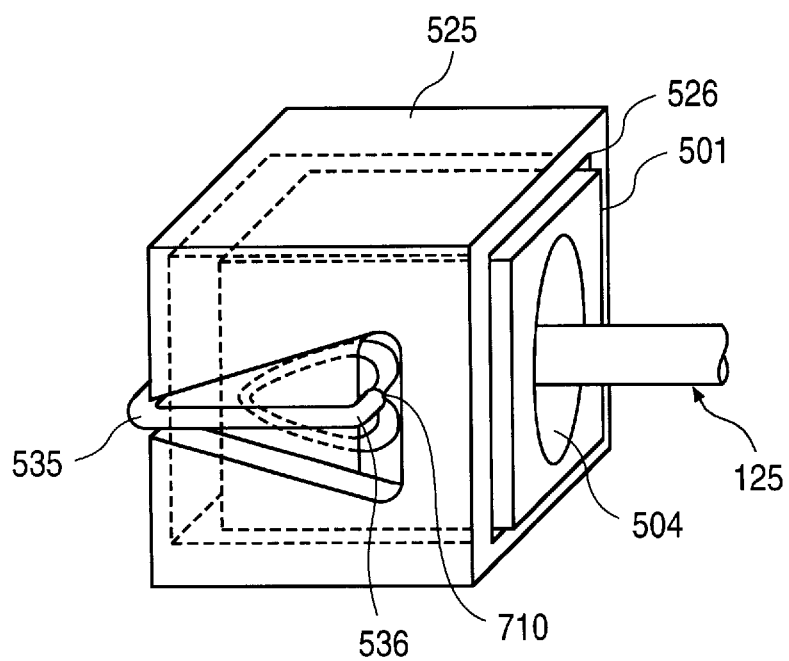
FIG. 9 is a perspective view of the connection module in the docked position.

Referring to FIG. 9, the connection module 320 is shown in the docked position with the alignment pin 125 inserted. Not shown is the mounting block 412. In the docked position the end portion 536 is in location 710 of the wire track 507. The end portion 536 provides a retaining force against the inside wall 711 of the wire track 507 to retain the sliding block 501 from being pushed out by compression spring 545.

Referring to FIG. 10, a side view of the connection module 320 in the docked position is shown with a phantom view of the sliding block 501, retainer pin 515, and alignment pin 125. When the sliding block 501 is in the docked position, the retaining pin 525 is in the second position where a portion of the retaining pin 515 resides in the alignment tube 601. In this position, a portion of the retaining pin is also located in a portion of the recess 410 of the alignment pin 125. The gripping surface 1010 provides a force against the retaining surface 1015 of recess 410. This force prevents the sliding block 501 from moving away from the docking station 14 when in the retaining pin is in the second position. The pin retainer recess 605 is of a curved shape that allows the pin retainer 515 to pivot on hinge 1022 within the sliding block 501 between the first position and the second position.

Figure 11:
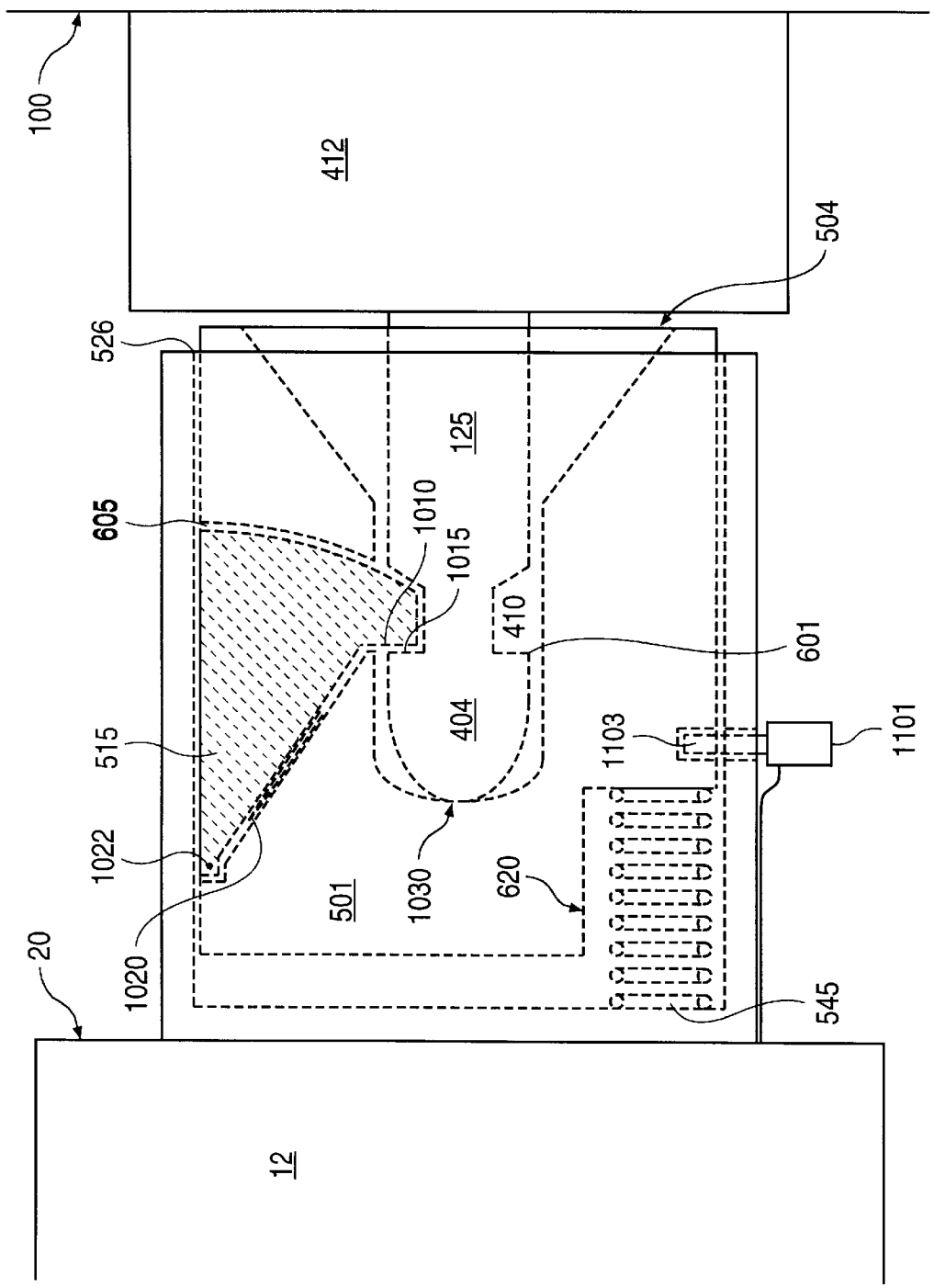
FIG. 11 is a phantom view of the connection module in the docked position including an electronic locking device.

FIG. 11 shows the docking connector with a electronically controlled locking mechanism to prevent the ejection of the portable computer 12 when it is transferring data to the docking station 14 or vice versa.

The insertion and docking operations will now be described below. To dock the portable computer 12 to the docking station 14 in the embodiment shown in FIG. 1, the user inserts the back portion of the portable computer 12 through the front opening 60 and into the docking bay 90. The user lines up the portable computer guide rail 28 with the docking station guide rails 104 at the wide ends 105. As the user pushes the portable computer 12 further into the docking bay 90, the guide rails 104 narrow so as to grossly align the portable computer within the docking bay 90 to a position where the alignment pins 125 and 127 will enter the alignment holes 504 of connection modules 320 and 325.

The rest of the description of the insertion and docking operations below describes the interaction of connection module 320 and alignment pin 125. For the embodiment shown in FIG. 1, however, an identical interaction between connection module 325 and alignment pin 127 occurs at the same time. However, other embodiments may include only one connection module.

As the portable computer is pushed further in, the alignment pin 125 further penetrates into the alignment tube 601. The tapered shape of alignment hole 504 into the alignment tube 601 more precisely aligns the portable computer so that the portable computer electrical connector 310 will be able to mate the docking station electrical connector 120 as the portable computer 12 is pushed further towards the docked position.

When the sliding block 501 is in the open position, as shown in FIGS. 6 and 8 and is ready to receive alignment pin 125, the pin retainer 515 is first position where a portion of pin retainer 515 lies above the top surface of sliding block 501. As the portable computer 12 is pushed further into the docking bay 90 and the alignment pin further penetrates the alignment tube 601, the rounded end 404 contacts the end 1030 of the alignment tube 620.

As the portable computer is pushed further towards the docking position, the rounded end 404 of alignment pin 125 pushes the end 1030 of alignment tube 601 to move sliding block 501 within the encasing portion in a direction towards the portable computer. Since compression spring 545 is pushing the sliding block 501 in the opposite direction, the force supplied by the user to push the portable computer to the docked position must be sufficient to compress spring 545.

In an alternative embodiment, the alignment pin 125 and mounting block 412 are arranged in such a way that the alignment block 412 pushes the front surface 503 of sliding block 501 to move the sliding block 501 within the encasing portion.

As sliding block 501 is pushed back into the encasing portion 525, the top edge 526 of the front side of the upper portion 527 of the encasing portion 525 provides a force on the top surface 516 of retaining pin 515 so as to rotate retaining pin 515 on hinge 1022 (FIG. 10) in a clockwise direction, relative to the view shown on FIG. 10. As the sliding block 501 is pushed further in to the encasing portion 525, the edge portion 526 pushes down on top surface 516 so as to rotate the retaining pin from an original first position shown in FIGS. 8 when the connection module was in the open position, to a second position shown in FIG. 10, where the connection module is in a docked portion. In the docked position the top surface 516 of the return pin 515 is flush, or nearly flush, with the top surface of the sliding block 501.

When the connection module 320 is in the open position as shown in FIG. 8, the end portion 536 is at location 701 of wire track 507. As the sliding block 501 is pushed into the encasing portion 525, the wire end 536 travels in the lower groove 706 of wire track 507 until the sliding block reaches the docked position where the end portion resides 536 at location 710 as shown in FIG. 9. In the embodiment shown, the wire track is "heart shaped" with the lower track 706 including a hump 707 where the end portion changes direction and travels back towards location 710. This change of direction in the wire track 507 requires that when docking the portable computer 12 into docking station 14, the user must push the portable computer 12 slightly further into the docking station 14 than will be the position of the portable computer 12 with respect to the docking station 14 when the portable computer is in the dock position. However, this overtravel of the portable computer 12 during insertion may be eliminated or significantly reduced by changing the design of wire track 507 to reduce or eliminate hump 707 (see FIG. 7).

After the alignment pin 125 has entered the alignment tube 601, portable computer electrical connector 310 is aligned with docking station electrical connector 120. Upon further insertion of the portable computer 12, the portable computer electrical connector 310 and the docking station 120 are mated so that the two connectors 310 and 120 are electrically connected when the portable computer 12 is in the docked position.

Referring to FIG. 10, in the dock position, retaining pin 515 is in its second position where a portion of the retaining pin 515 is resting in the alignment tube 601 and in the recess 410 of alignment pin 125. In such a position, the sliding block is in a fixed or secured position as to the alignment pin 125, and therefore, to the docking station 14. Referring to FIG. 9, when the sliding block is in the docked position, end portion 536 is at location 710 of wire track 507. Although spring 545 is providing a force to push sliding block 501 away from compression spring 545, or to the right, relative to the view shown in FIG. 10, end portion 536 pressing against wall 711 at location 710 provides a retaining force to prevent the sliding block from being moved to the right with respect to the encasing portion 525, relative to the view shown in FIG. 10.

When in the docked position, a user will be unable to remove the portable computer 12 from the docking bay 90 by pulling the portable computer 12 in a direction away from the docking bay back wall 100. When retaining pin 515 is in the second position as shown in FIG. 10, gripping surface 1010 of retaining pin 515 faces the retaining surface 1015 of alignment pin 125. Thus, the retaining surface 1015 provides a restraint against gripping surface 1010 to counter any force that would move sliding block 501 away from alignment pin 125, or to the left, relative to the view shown on FIG. 10. The back wall 711 of wire track 507 provides a restraint against end portions 536 located in position 710 so that the encasing portion 525 (or portable computer 12) can not be moved away from sliding block 501, or moved in a direction to the left, relative to the view shown in FIG. 10. Any force moving the portable computer 12 directly away from the back wall 100 of docking station 14 will be restrained from moving by the sliding block 501 which, in turn, is restrained from moving by the alignment pin 125.

The ejecting operation will now be described below. To eject the portable computer 12 from the docking bay 90, the user pushes the portable computer 12 further into the bay 90 towards the direction of back wall 100. Being fixed to the portable computer, the user's push moves the encasing portion towards the back wall 100. Referring to FIG. 7, this push moves end portion 536 to the right, relative to the view shown in FIG. 7, in wire track 507 against forward wall 713 which deflects the end portion 536 to the upper groove 727. Once the end portion 536 has passed hump 716 where the wire track changes directions, the user ceases pushing on the portable computer 12. After the user ceases pushing, the force from compression spring 545 against sliding block 515 pushes the encasing portion 525 (and the portable computer 12) away from the sliding block 501, or to the left, relative to the view shown on FIG. 10. As the top edge 526 of the encasing portion 525 moves to the left relative to the view on FIG. 10, it moves past the retaining pin 515 to where it no longer provides a force to counter spring 1020. With no countering force, spring 1022 rotates the retaining pin 515 in a counter clockwise direction, relative to the view shown on FIG. 10, where the retaining pin 5 15 clears the recess 410 of the alignment pin 125 and clears the alignment tube 601. At this point the sliding block 501 is no longer secured or fixed to the alignment pin 125. However, as spring 545 continues to unwind, it pushes sliding block 501, and more specifically end portion 1030 of tube 601 against head portion 404 of alignment pin 125, which is fixed against the back wall 100 by mounting block 412. Consequently, spring 545 unwinding pushes the portable computer 12 away from back wall 100 and provides the force necessary to unmate the portable computer electrical connector 310 from the docking station electrical connector 120.

Compression spring 545 continues to move the sliding block 501 in an outward direction which continues to move the portable computer 12 away from the back wall 100 until the end portion 536 has traveled in the top groove 727 to location 701. At this location, the back wall 702 provides a restraint against end portion 536 so that sliding block 501 no longer moves with respect to the encasing portion 525. At this point, spring 545 no longer moves the portable computer 12 a way from the back wall 100. Also at this point, the electrical connectors 310 and 120 are no longer mated or connected. The user then grabs the portable computer and removes it from the media bay 90.

Compression spring 545 must be capable of providing enough force to overcome the friction within the electrical connectors 120 and 310 over come the friction between the bay bottom 92 and the bottom of the computer 24 and between the docking station guide rails 104 and the portable computer guide rails 28.

Referring to FIG. 11, an electronic lock can be provided to prevent against the accidental ejection of the portable computer 12 while connected to the docking station. A solenoid 1101 is provided to electrically move a locking pin 1103 through a hole in the encasing portion 525 and into the sliding block 501. This locking pin 1103 prevents the sliding block 501 from moving with respect to the encasing portion 525 and thus prevents connection end 536 from leaving location 710. The solenoid is controlled by an electronic signal from the portable computer 12 or from the docking station 14. The location of the pin or the type of locking device may vary in different embodiments.

OTHER EMBODIMENTS

In another embodiment, the docking station may be of a construction where the docking bay 90 is open at the top.

While particular embodiments of the present invention have been shown and described, it will be obvious to those skilled in the art that changes and modifications may be made without departing from this invention and it's broader aspects and, therefore, the appending claims are to encompass within their scope all such changes and modifications as all within the true spirit and scope of this invention.

What is claimed is:

1. A portable computer docking and ejecting system comprising:

a first electrical connector attached to a portable computer, the first electrical connector electrically coupled to a processor within the portable computer;

a second electrical connector physically coupled to a docking station, the second electrical connector capable of being electrically coupled to at least one peripheral device, the second electrical connector capable of being mated to the first electrical connector, the processor electrically coupled to the second connector when the first electrical connector is mated to the second electrical connector, the first electrical connector mated to the second electrical connector when the portable computer system is in a docked position;

a spring physically linked to the portable computer and capable of providing a force against the docking station and a force against the portable computer, the spring in a loaded position when the portable computer is in the docked position;

a retaining member including a gripping surface, the retaining member physically linked to the portable computer, the retaining member movable as to the portable computer, the gripping surface capable of engaging a portion of the docking station to physically link the portable computer to the docking station, the retaining member in a first position when the gripping surface is engaged with the portion of the docking station, the retaining member capable of moving from the first position to disengage the gripping surface from the portion of the docking station.

2. The system of claim 1 further comprising:

second retaining member, the second retaining member physically coupled to the portable computer, the second retaining member providing a restraining force to counter to the force provided by the spring.

3. The system of claim 1 further comprising:

a first body, the first body having a first surface and a second surface, the first surface in contact with the spring, the second surface capable of contacting the docking station, the spring capable of providing a force against the first body so that the second surface provides a force against the docking station.

4. The system of claim 3 further comprising:

a second retaining member, physically coupled to the portable computer;

a groove, the groove located on a surface of the first body, the groove receiving a portion of the second retaining member, the portion of the second retaining member providing a restraining force against a side wall of the groove at a first location when the portable computer is in the docked position.

5. The system of claim 4 wherein:

when the end portion is in the first location, the gripping surface is in the first position.

6. The system of claim 3, wherein:

the portion of the second retaining member providing a restraining force against a second sidewall of the groove at a second location;

when the portion of the second retaining member is in the second location, the gripping surface is disengaged from the portion of the docking station.

7. The system of claim 6 wherein:

when the portion of the second retaining member is in the second location, the spring does not provide a force against the docking station.

8. The system of claim 1 wherein the retaining member is slidably secured to the portable computer, wherein when the gripping surface engages a portion of the docking station, the portable computer being slidibly secure to the docking station.

9. The system of claim 1 where the portion of the docking station is an alignment pin.

10. The system of claim 9 where the alignment pin has a recess for receiving the gripping surface.

11. The system of claim 1 further including:

a first body, the first body physically linked to the portable computer, the first body having a first opening capable of receiving the portion of the docking station, the first body having a second opening capable of receiving at least a portion of the gripping surface of the retaining member when the retaining member is in the first position.

12. The system of claim 11 wherein:

the first opening is an alignment hole, the alignment hole having a first width at a surface of the first body, the alignment hole having a second width at a location in an interior portion of the first body, the first width being wider than the second width.

13. The system of claim 11 further comprising:

a hinge, the hinge connected to the retaining member and to the first body, the retaining member capable of pivoting on the hinge to and from the first position.

14. The system of claim 13 further comprising:

a second spring, the second spring providing a force against the retaining body and the hinge, the spring biasing the hinge to so that the retaining body rotates away from the first position, the spring capable of moving the retaining body from the first position to disengage the gripping surface from the portion of the docking station.

15. The system of claim 11 wherein:

the first body is slidably secure to the computer system.

16. The system of claim 1 wherein:

when the retaining pin is in the first position, a force applied to the portable computer causes the retaining pin to move from the first position to disengage the gripping surface from the portion of the docking station.

17. The system of claim 1 wherein:

a force applied to the portable computer causing the spring to move the portable computer in an opposite direction to the force, the movement of the portable computer unmating the first electrical connector from the second electrical connector.

18. A computer system comprising:

a processor;

a housing encasing the processor;

a first electrical connector electrically coupled to the processor, the first electrical connector physically coupled to the housing;

a second electrical connector, the second electrical connector electrically coupled to a peripheral device, the second connector capable of being mated to the first electrical connector, when the second electrical connector is mated to the first electrical connector, the processor is electrically coupled to the peripheral device;

a spring physically linked to the housing and capable of providing a force against a first body physically attached to the second connector and a force against the housing, the spring in a loaded position when the first electrical connector and the second electrical connector are mated;

a retaining member including a gripping surface, the retaining member secured to the housing, the retaining member movable as to the housing, the gripping surface engaging the first body, the retaining member in a first position when the gripping surface is engaged with the first body, the retaining member capable of moving from the first position to disengage the gripping surface from the first body.

* * * * *

UNITED STATES PATENT AND TRADEMARK OFFICE
CERTIFICATE OF CORRECTION

PATENT NO.     : 5,818,691
ISSUE DATE     : October 6, 1998
INVENTOR(S)    : McMahan, Robert L.; Podwalny, Sergey G.

It is certified that error appears in the above-identified patent and that said Letters Patent is hereby corrected as shown below:

Column 14, line 64; before the word "second" in the first instance, please insert --a--

Signed and Sealed this

Fourteenth Day of September, 1999

Attest:

Q. TODD DICKINSON

*Attesting Officer*       Acting Commissioner of Patents and Trademarks